United States Patent
Hoogzaad et al.

(10) Patent No.: US 10,218,316 B2
(45) Date of Patent: Feb. 26, 2019

(54) FLIP CHIP CIRCUIT

(71) Applicant: NXP B.V., Eindhoven (NL)

(72) Inventors: Gian Hoogzaad, Mook (NL); Tony Vanhoucke, Bierbeek (BE); Mark Pieter van der Heijden, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/596,233

(22) Filed: May 16, 2017

(65) Prior Publication Data

US 2018/0006614 A1 Jan. 4, 2018

(30) Foreign Application Priority Data

Jun. 30, 2016 (EP) .................... 16177373

(51) Int. Cl.
*H01L 23/48* (2006.01)
*H03F 1/30* (2006.01)
*H01L 23/498* (2006.01)
*H01L 23/66* (2006.01)
*H01L 23/00* (2006.01)
*H03F 1/02* (2006.01)
*H03F 3/195* (2006.01)
*H03F 3/213* (2006.01)
*G01K 7/01* (2006.01)
*H01L 23/367* (2006.01)
*H01L 23/373* (2006.01)
*H01L 27/02* (2006.01)

(52) U.S. Cl.
CPC .......... *H03F 1/30* (2013.01); *G01K 7/01* (2013.01); *H01L 23/3677* (2013.01); *H01L 23/3736* (2013.01); *H01L 23/49844* (2013.01); *H01L 23/66* (2013.01); *H01L 24/06* (2013.01); *H01L 24/14* (2013.01); *H01L 27/0248* (2013.01); *H03F 1/0288* (2013.01); *H03F 3/195* (2013.01); *H03F 3/213* (2013.01); *H01L 2224/0401* (2013.01); *H03F 2200/447* (2013.01); *H03F 2200/451* (2013.01)

(58) Field of Classification Search
None
See application file for complete search history.

(56) References Cited

U.S. PATENT DOCUMENTS 8,456,856 B2 * 6/2013 Lin ................ H01L 23/60
257/686
2012/0049345 A1 3/2012 Railkar et al.
(Continued)

FOREIGN PATENT DOCUMENTS

WO WO-2015/097962 A1 7/2015

OTHER PUBLICATIONS

European Patent Application No. 16177369.2 filed Jun. 30, 2016, 28 pages.

(Continued)

*Primary Examiner* — Hung Vu (57) ABSTRACT

A flip chip circuit comprising: a semiconductor substrate; a power amplifier provided on the semiconductor substrate; and a metal pad configured to receive an electrically conductive bump for connecting the flip chip to external circuitry. At least a portion of the power amplifier is positioned directly between the metal pad and the semiconductor substrate.

15 Claims, 3 Drawing Sheets

(56) References Cited

U.S. PATENT DOCUMENTS

| | | |
|---|---|---|
| 2012/0063097 A1 | 3/2012 | Reza et al. |
| 2012/0146193 A1* | 6/2012 | Stuber .................. H01L 23/36 257/618 |
| 2013/0071969 A1* | 3/2013 | Vodrahalli .......... H01L 25/0657 438/107 |
| 2014/0131860 A1 | 5/2014 | Kanda et al. |
| 2015/0303881 A1* | 10/2015 | Blednov ................ H03F 3/213 330/289 |
| 2015/0380343 A1 | 12/2015 | Koontz et al. |

OTHER PUBLICATIONS

European Patent Application No. 16177378.3 filed Jun. 30, 2016, 23 pages.
European Patent Application No. 16177387.4 filed Jun. 30, 2016, 30 pages.

* cited by examiner

FLIP CHIP CIRCUIT

CROSS-REFERENCE TO RELATED APPLICATIONS

This application claims the priority under 35 U.S.C. § 119 of European patent application no. 16177373.4, filed Jun. 30, 2017 the contents of which are incorporated by reference herein.

The present disclosure relates to flip chip circuits and in particular, although not necessarily, to flip chip circuits that include at least one power amplifier.

According to a first aspect of the present disclosure there is provided a flip chip circuit comprising:
  a semiconductor substrate;
  a power amplifier provided on the semiconductor substrate;
  a metal pad configured to receive an electrically conductive bump for connecting the flip chip to external circuitry;
  wherein at least a portion of the power amplifier is positioned directly between the metal pad and the semiconductor substrate.

In one or more embodiments the flip chip circuit further comprises a metal stack positioned between the metal pad and the power amplifier. The metal stack may comprise a plurality of metal layers configured to provide a thermal bridge between the power amplifier and the metal pad. The metal layers may be thermally, and optionally electrically, connected to each other.

In one or more embodiments the flip chip circuit further comprises an electrically conductive bump coupled to the metal pad. The electrically conductive bump may comprise a metal pillar that extends away from the metal pad and the semiconductor substrate.

In one or more embodiments the flip chip circuit may further comprise an insulating layer having an aperture. The metal pad may be coupled to the electrically conductive bump through the aperture. The electrically conductive bump may extend across at least a portion of the insulating layer.

In one or more embodiments the power amplifier comprises a plurality of power transistors distributed across the semiconductor substrate.

In one or more embodiments the flip chip circuit comprises: a plurality of power amplifiers provided on the semiconductor substrate; and a plurality of metal pads, each configured to receive an electrically conductive bump for connecting the flip chip to external circuitry.

At least a portion of each of the plurality of power amplifiers may be positioned directly between a metal pad and the semiconductor substrate.

In one or more embodiments at least a portion of two or more of the plurality power amplifiers is positioned directly between a metal pad and the semiconductor substrate. At least a portion of a power amplifier may be positioned directly between two or more of the plurality of metal pads and the semiconductor substrate.

In one or more embodiments the flip chip circuit further comprises a plurality of bias circuits. Each bias circuit may be associated with one of the plurality of power amplifiers. The bias circuits may be configured to provide bias voltages to the associated power amplifiers independently of each other.

In one or more embodiments an electrically conductive bump is coupled to each of the plurality of metal pads. Each of the electrically conductive bumps may be metallically coupled to each other. Each of the electrically conductive bumps may be integrally formed.

In one or more embodiments the flip chip circuit further comprises:
  a temperature sensor with a plurality of temperature sensitive components, each temperature sensitive component provided proximal to a respective one of the plurality of power amplifiers, and
  a controller, configured to control the plurality of power amplifiers based on a temperature determined by the temperature sensor.

In one or more embodiments each of the plurality of temperature sensitive comprises a NPN transistor.

In one or more embodiments the first power amplifier comprises a BiCMOS integrated circuit.

There may be provided a Doherty amplifier comprising:
  a main stage comprising a main amplifier;
  a peaking stage comprising a peaking amplifier;
wherein the main amplifier and the peaking amplifier each comprise any flip chip circuit disclosed herein.

In one or more embodiments the entire first power amplifier may be positioned directly between the first metal pad and the semiconductor substrate.

There may be provided a communications base station comprising any flip chip circuit disclosed herein.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF DRAWINGS

One or more embodiments will now be described by way of example only with reference to the accompanying drawings in which.

Following the trend in wireless infrastructure, there has been a move towards more heterogeneous networks to fulfil the global demand for high data rate services. Small-cell base stations are deployed to enhance the capacity in the networks by increased re-use of the frequency spectrum over a denser grid. This brings the power level per small-cell base station power amplifier into the Silicon Germanium (SiGe) and Gallium Arsenide (GaAs) semiconductor device domain with peak power levels up to around 4 W. Alternatively, it may be advantageous to leverage the integration capabilities of a combined Bipolar junction transistor and Complementary Metal-Oxide-Semiconductor transistor (BiCMOS) process. BiCMOS devices may provide superior performance compared to GaAs or SiGe devices. Flip chip circuits of the present disclosure may include a power amplifier in the form of a BiCMOS integrated circuit.

A GaAs die may include integrated Radio Frequency (RF) power transistors. The die may be wire bonded to a leadframe or laminate. Since wire bonding by itself may not provide a good electrical and thermal path, the GaAs die can have Through Wafer Vias (TWV's) to provide a suitable conductive electrical and thermal path to the package diepad. Attempts to implement small-cell base station power amplifiers in cheaper silicon technology like SiGe may use the same construction: wire bonding and a silicon technology including Through Silicon Vias (TSV's) to provide a good electrical and thermal path.

However, it can be advantageous to implement a small-cell power amplifier in silicon technology without TSV's because this may be more cost-effective. To have high conductive electrical and thermal paths, flip-chip package technology may be used. The flip-chip construction can be exploited for the physical design of the power transistors in a way that may provide thermal and/or electrical performance advantages that go beyond the fundamental limitations of wire bonded constructions.

Wire bonded power amplifier products may have the output transistors adjacent to the pads and adjacent to the Through Substrate Vias. This may not yield the shortest path electrically or thermally. The output transistors cannot be under the pads because of mechanical risks: significant force is used to bond a wire onto a bond pad which may damage any output transistor that is positioned under the bond pad. It is not possible to position the output transistors under the TSV's because the TSV's are connections from the metal stack to bottom of the substrate/wafer. Consequently, there is no region "under" the TSV that may accommodate the output transistors. The electro-thermal path in such devices would be dominantly through the TSV's down to the bottom of the integrated circuit, which can be mounted on a ground plane. The ground plane is further connected to the exposed die pad of the package.

However, as discussed below, flip chip power amplifier devices can have their output transistors partly or fully under a bump pad; a bump pad is different to a bond pad that is used in bonded power amplifier products. The connection of the bump pad to the package (for example lead frame or laminate) is provided without the use of mechanical force, such as by soldering or deposition of copper pillars. As will be discussed below, this can advantageously enable placement of the transistors under the bump pad with a reduced possibility that they will be damaged during the manufacturing process.

A flip chip provides for a convenient way of connecting a semiconductor device, such as an integrated circuit, to external electrical circuitry. Electrical connections between the semiconductor device and the external circuitry are provided via electrically conducting bodies, which may be called bumps, that are placed on the surface of the flip chip. Bumps may be made from solder or other metals, combinations of solder components with other metal components, or even from non-metallic electrically conductive materials.

Figure 1A:
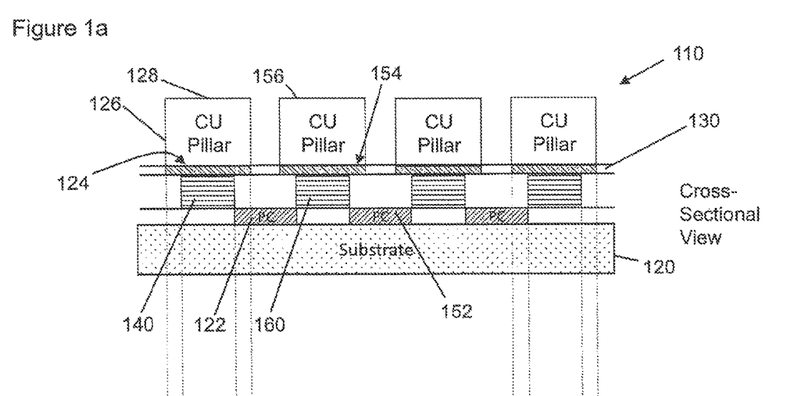
FIGS. 1a and 1b show an example embodiment of part of a flip chip circuit, both in cross-section and plan view.
Figure 1B:
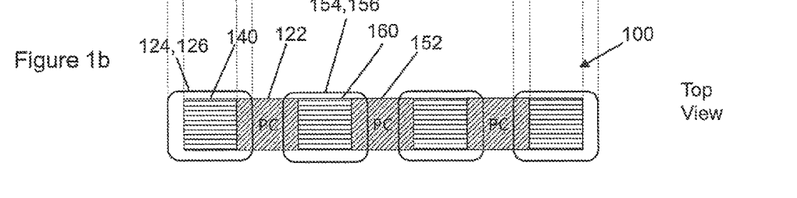

FIG. 1a shows a cross-section side view 110 of part of a flip chip circuit, and FIG. 1b shows a corresponding plan view 100. Features of the plan view 100 correspond to features of the cross-section side view 110 that are vertically above the plan view 100, as drawn in FIGS. 1a and 1b.

The flip chip circuit has a semiconductor substrate 120, which in this example is made from silicon. A first power amplifier 122 is provided on the semiconductor substrate 120. A first metal pad 124 is provided to receive a first electrically conductive bump for connecting the flip chip to external circuitry (not shown). As will be discussed below, the first power amplifier 122 may comprise one or more power transistors that together may be referred to as a power cell.

In the example shown in FIGS. 1a and 1b the first metal pad 124 is part of the top level metal 130, which will have a finite thickness. In this example the first metal pad 124 is defined as a surface of the top metal 130 that is electrically exposed such that it may be electrically coupled to the copper pillar 126.

In the example of FIG. 1, the first electrically conductive bump includes a copper pillar 126 that is electrically coupled to the first metal pad 124. The copper pillar 126 is an example of an electrically conductive pillar that extends away from the first metal pad 124 and the semiconductor substrate 120. The copper pillar 126 may be augmented by adding a quantity of solder (not shown) on the top surface 128 of the copper pillar 126 to provide the first electrically conductive bump. The solder may enable a good electrical connection to be made between the copper pillar 126 and the external circuitry. In other examples the copper pillar 126 may be replaced by a metal pillar made from one or more suitable metals such as gold, silver or aluminium et cetera.

A portion of the first power amplifier 122 is positioned directly between the first metal pad 124 and the semiconductor substrate 120. Being positioned directly between the first metal pad 124 and the silicon substrate 120 means that a shortest path between part of the first metal pad 124 and part of the silicon substrate 120 intersects with the position of at least part of the first power amplifier 122. For example, as shown in the cross-sectional view 110 of FIG. 1a, a vertical line drawn from the right hand side of the first metal pad 124 would intersect with the left hand side of the first power amplifier 122 before reaching the silicon substrate 120. Equivalently, as shown in the plan view 100 of FIG. 1b, the first power amplifier 122 may be said to be positioned at least partially within the footprint of the first metal pad 124, where the footprint is the envelope of space defined by the perimeter of the first metal pad 124 when viewed from above.

It will be appreciated that when the first power amplifier 122 is operational it will dissipate heat. Positioning the first power amplifier 122 such that it is directly underneath the first metal pad 124 can advantageously enable an efficient conduction of heat away from the first power amplifier 122 through the first metal pad 124, through the copper pillar 126 and ultimately out of the flip chip and into the external circuitry. In particular, as will be discussed below, the heat can be conducted away from the first power amplifier 122 to the first metal pad 124 through a metal stack 140.

Typically, some regions of the top level metal 130 will be coated with an insulating layer (not shown) on the surface of the top level metal 130 that is further from the silicon substrate 120. Such an insulating layer can have an aperture through which the first metal pad 124 is coupled to the first electrically conductive bump. In this example, the copper pillar 126 of the first electrically conductive bump extends across the entire surface of the first metal pad 124. However, it will be appreciated that in other examples (not shown) a metal pillar may further extend across at least a portion of the insulating layer, and/or may extend across only part of the first metal pad 124.

FIGS. 1a and 1b also shows a metal stack 140 positioned between the first metal pad 124 and the semiconductor substrate 120. In this example, the metal stack 140 is not positioned directly between the first power amplifier 122 and the first metal pad 124, but is instead positioned adjacent to the first power amplifier 122 without overlapping the first power amplifier when viewed from above, as shown in FIG. 1b. In this example the metal stack 140 is not arranged to be electrically coupled to the first power amplifier 122. It will be appreciated that metal layers (not shown) may also be positioned on top of the first power amplifier 122 in order to provide electrical connections with the first power amplifier 122.

The metal stack 140, which will be discussed in greater detail in relation to FIG. 3 below, contains a plurality of metal layers. Since the metal layers are made of materials that have a high thermal conductivity, and a sufficient area, the metal stack 140 provides a thermal bridge between the first power amplifier 122 and the first metal pad 124. Generally, a thermal bridge is any component or set of components that provide a pathway with high thermal conductivity that enables efficient conduction of heat across the thermal bridge. The metal stack 140 therefore advantageously improves thermal conduction of dissipated heat away from the first power amplifier 122, when in operation, to the external circuitry. In other examples the metal stack 140 can also be used to provide an electrical connection between the first power amplifier 122 and the first metal pad 124.

FIGS. 1a and 1b also shows a second power amplifier 152, provided on the semiconductor substrate 120, that is remote from the first power amplifier 122; the first power amplifier 122 and the second power amplifier 152 are situated on different parts of the semiconductor substrate 120. A second metal pad 154 is provided to receive a second electrically conductive bump for connecting the flip chip to the external circuitry. As with the first electrically conductive bump described above, the second electrically conductive bump has a second copper pillar 156, which may also be augmented with a quantity of solder (not shown).

A portion of the second power amplifier 152 is positioned directly between the second metal pad 154 and the semiconductor substrate 120. This arrangement may improve thermal conduction of dissipated heat away from the second power amplifier 152, when in operation. In this example, part of the first power amplifier 122 is also positioned directly between the second metal pad 154 and the semiconductor substrate 120. Therefore, the second metal pad 154 may also advantageously improve thermal conduction of heat dissipated by the first power amplifier 122 when in use. Such thermal conduction may also be improved by a second metal stack 160 positioned directly between the semiconductor substrate 120 and the second metal pad 154.

It will be appreciated that a plurality of power amplifiers may be distributed across a semiconductor substrate, and that a corresponding plurality of metal pads and electrically conductive bumps can be used. As shown in FIGS. 1a and 1b, at least a portion of two or more of the plurality of power amplifiers can be positioned directly between a metal pad and the semiconductor substrate. Also, at least a portion of a single power amplifier can be positioned directly between two or more of the plurality of metal pads and the semiconductor substrate. In this way, heat dissipated by any of the power amplifiers, when operational, may advantageously be conducted away through the electrically conductive bumps to external circuitry.

In some examples the first power amplifier 122 may be electrically coupled to the copper pillar 126, via the metal stack 140, for example to provide an electrical output via the copper pillar 126 to the external circuitry. By providing a shorter pathway for the amplified output of the first power amplifier 122, power efficiency may be improved by avoiding or reducing some dissipative losses. However, even where the first power amplifier 122 is not electrically coupled to the copper pillar 126, because, for example, it is coupled to a remote metal pad or another internal component, the thermal advantages discussed above will still be provided by the flip chip circuit disclosed herein. In some applications, one or more power amplifiers can be electrically connected to a copper pillar 126 for its ground terminal.

Figure 2:
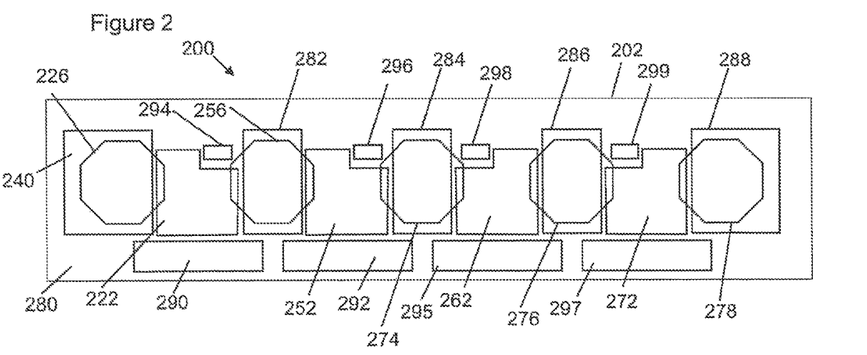
FIG. 2 shows an example embodiment of part of a flip chip circuit with part of a power amplifier in plan view.

FIG. 2 shows a plan view of a main power amplifier 200, which may be part of a Doherty amplifier provided in a flip chip circuit. The main power amplifier 200 has a first power amplifier 222, a second power amplifier 252, a third power amplifier 262 and a fourth power amplifier 272. Each of these four power amplifiers are used together to provide the functionality of the main power amplifier 200. Since there are four power amplifiers in total, the first power amplifier 222, or any of the others, may be described as one quarter of the main power amplifier 200.

Distributing the functionality of the main power amplifier between the four power amplifiers 222, 252, 262, 272 can allow dissipated heat to be distributed, which advantageously reduces the likelihood of hotspots developing within the main power amplifier 200.

The use of a plurality of power amplifiers 222, 252, 262, 272 (power cells) can also enable a more balanced connection, having equal electrical paths, for the transistor devices in the power amplifiers 222, 252, 262, 272, which may be in parallel with each other. This is because they can be electrically coupled to respective electrically coupled bumps that are the same distance away from their respective power cells. Also, the use of a plurality of power amplifiers in this way can provide for safe and stable operation of the flip chip by avoiding or reducing the likelihood of overheating, and also by reducing the difference in temperature between the different power amplifiers to maintain a lower absolute temperature, and also a lower temperature gradient.

Five metal stacks 240, 282, 284, 286, 288 are shown in FIG. 2. Each power amplifier 222, 252, 262, 272 is positioned between two metal stacks 240, 282, 284, 286, 288 such that two metal stacks can be used to conduct heat away from each power amplifier. Five dedicated thermal bump pads 226, 256, 274, 276, 278, which are examples of metal pads, are shown in FIG. 2. Each of the five thermal bump pads is positioned directly above a metal stack, and is also positioned directly above one or two of the power amplifiers. In this way, a thermal bump pad can be used to communicate heat away from one or two associated power amplifiers through respective metal stacks.

The first power amplifier 222 in this example is sandwiched between a first dedicated thermal bump pad 226 and a second dedicated thermal bump pad 256. If the first metal pad 226 and the second metal pad 256 are provided for thermal, and not electrical, purposes they may be described as dedicated thermal bump pads.

The metal stacks 240, 282, 284, 286, 288 can be optimized such that a Shallow Trench Isolation (STI) opening in the semiconductor substrate 202 can be provided. That is, an STI opening can be provided in the semiconductor substrate 202 underneath the metal stacks because that region of the semiconductor substrate 202 is not used as active area to provide the functionality of a power amplifier. The metal stacks 240, 282, 284, 286, 288 are provided at the sides of, and in between, the power amplifiers 222, 252, 262, 272 to increase heat flow to the thermal bump pads.

In this example the metal pads are octagonal in cross-section, however, it will be appreciated that any other regular or irregular shape could also be employed.

Each of the power amplifiers 222 has an associated bias circuit 290, 292, 295, 297 in this example. The bias circuits 290, 292, 295, 297 may be configured to provide bias voltages or currents to their respective power amplifiers, independently of each other. This may be referred to as distributed biasing, in that each power amplifier can have its own bias circuit. Independent control of bias voltages may enable more efficient operation of the main power amplifier 200 as bias voltages may be set based on the operating parameters, such as power output or temperature, that are relevant to each power amplifier individually.

Also, distributed biasing can provide for safe and stable operation of the flip chip by avoiding or reducing the likelihood of overheating or hotspot creation. Optionally, the bias circuits can each have a mirror transistor, which is advantageously thermally coupled to power transistors in the associated power amplifier.

Optionally, emitter degeneration resistors may be added to the circuit to help to stabilize the transistors. If any one of the transistors conducts some more current compared to its neighbour (because of self-heating or gradients in temperature, for example), the higher current will create a voltage drop across the emitter degeneration resistors such that the transistor will be subject to a lower voltage and therefore the current conducted by the transistor will be reduced. Such resistors act to prevent the transistor from experiencing a "run away" heating effect, by providing a negative feedback loop.

The emitter degeneration resistors may be positioned in close proximity to the emitter fingers. One resistor may be provided for each emitter finger or one resistor per group of fingers (for example, one resistor for a group of 3 emitter fingers). The emitter degeneration resistors may be standard resistors available from a BiCMOS library (e.g. poly resistors).

The example of FIG. 2 also includes a distributed temperature sensor. The temperature sensor in this example includes four temperature sensitive components 294, 296, 298, 299, each associated with one of the power amplifiers 222, 252, 262, 272. The temperature sensitive components can be provided near the main output transistors of the main power amplifier, because these transistors are likely to be the hottest parts of the integrated circuit. In the example of FIG. 2, the main amplifier, and hence also the output transistor, is split into four sections for power distribution. Therefore, in this example, the temperature sensor is also distributed across these four sections by associating each of the four temperature sensitive components 294, 296, 298, 299 with one of the four power amplifiers of the main power amplifier. An advantage of distributing the temperature sensor in this way this is that a matched layout (in terms of equality) per section is maintained.

Further details of an example implementation of the temperature sensor will now be described with reference to FIG. 4.

Figure 4:
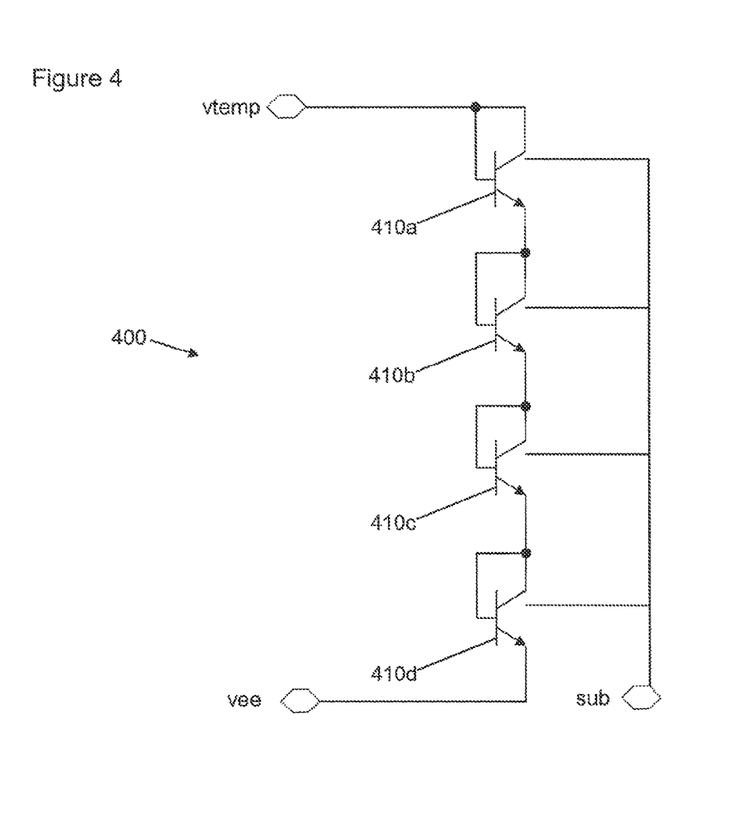
FIG. 4 shows an example embodiment of a distributed temperature sensor suitable for integration into a flip chip circuit of the present disclosure.

FIG. 4 shows a circuit diagram for a temperature sensor 400 that may be provided as an integral part of a flip chip circuit as disclosed herein. The temperature sensor 400 has a plurality of temperature sensitive components, which in this example includes a first NPN transistor 410a, a second NPN transistor 410b, a third NPN transistor 410c, and a fourth NPN transistor 410d. As shown in FIG. 2, each of these temperature sensitive components can be associated with an individual power cell/amplifier.

In some applications, the use of NPN transistors as the temperature sensitive components can be advantageous, when compared with PNP transistors, because NPN transistors can have much better substrate isolation. These temperature sensor NPN transistors 410a-d can be provided close to the power amplifier power transistors to provide for good thermal coupling to the power transistors.

In this example, the NPN transistors 410a-d are connected in series for increased temperature sensitivity. Consequently, the individual temperature dependence of each of the plurality of junctions of the NPN transistors 410a-d (for example 4× 2 mV/dC for silicon) will be available in the sensor. This may improve the robustness of the sensor relative to external influences like offsets and measurement errors. Also, the NPN transistors 410a-d are connected together such that the temperature sensor provides an average temperature signal, which is representative of the average temperature of the temperature sensitive components. Consequently, the temperature sensor consists of four diode-connected transistors in series 410a-d so that one transistor can be positioned proximal to each distributed section of an output transistor. Advantageously, a ground return wire of the temperature sensor loop may be positioned under a connection track in order to avoid or reduce coupling of RF signals in the temperature sensor loop. In this way the ground return wire can be self-shielded.

It will be appreciated that any other type of temperature sensitive component may be used in place of NPN transistors, to provide a temperature signal representative of the temperature of the component parts of a power amplifier.

Returning to FIG. 2, each of the power amplifiers 222, 252, 262, 272 may also be coupled to an associated controller (not shown). The controller may receive temperature signalling from the associated temperature sensitive components 294, 296, 298, 299. Based on a temperature of an associated power amplifier 222, 252, 262, 272 determined from the temperature signalling, the controller may provide a control signal to the associated power amplifier to modify the performance of the amplifier. For example, the control signal may change the bias voltage provided by the associated bias circuit 290 based on the detected temperature, or change the input power provided to the amplifier. In an example where the main power amplifier 200 is part of a Doherty amplifier, which also comprises a peaking amplifier (as is well known to those skilled in the art), the control signal may change the take-over point where the peaking amplifier starts delivering power together with the main amplifier. This take-over point may be determined by the offsetted threshold in a class C peaking amplifier, for example.

In some examples, signalling from each of the temperature sensitive components 294, 296 may be combined to provide an average temperature signal. In such an example, each of the power amplifiers 222, 252, 262, 272 may be controlled in the same way as each other. This may enable use of only a single controller, which may make the circuit more efficient. Lack of individual control of each separate power amplifier may not present a problem because the amplifiers are sufficiently close together to be at approximately the same temperature.

Each of the power amplifiers 222, 252, 262, 272 can comprise a plurality of power transistors distributed across the semiconductor substrate 202. Since the power transistors of a power amplifier, such as the first power amplifier 222, are likely to dissipate the greatest amount of heat, at least a portion of one or more of the power transistors may be positioned directly between an associated metal pad 226, 256, 274, 276, 278 and the semiconductor substrate. For example, an active area of one or more of the power transistors of a power amplifier may be located under a metal pad, as shown in FIG. 2. In this way, the dissipated heat may be efficiently conducted through the metal pads, into an electrically conducting bump and out into an external circuit.

The physical design of the output transistors (in the power amplifiers 222, 252, 262, 272), the biasing circuitry 290, 292, 295, 297, and the temperature sensitive components 294, 296, 298, 299 disclosed herein may address one or more of the following problematic subjects: (i) thermal instability, (ii) high junction temperatures, which may result in reduced reliability/lifetime, since the flip chip circuits disclosed herein provide for superior cooling performance, and (iii) grounding instability. Grounding instability may be due to too much inductance, or too variable levels of inductance in ground connections of components on an integrated circuit. The use of appropriately positioned electrically conductive bumps may also provide for a solid ground connection for components provided on an integrated circuit.

Figure 3:
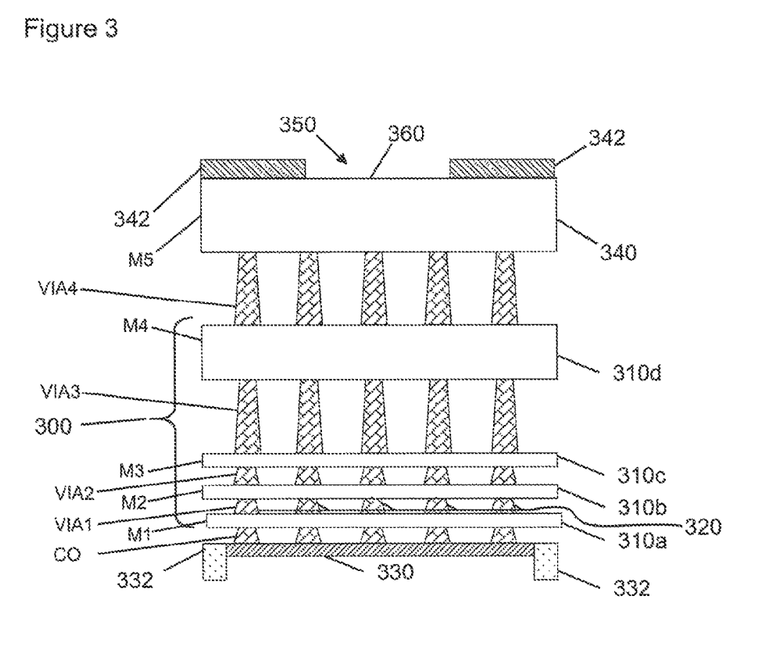
FIG. 3 shows an example embodiment of a metal layer stack for a flip chip circuit of the present disclosure.

FIG. 3 shows an example of a metal stack 300 of the type described above in relation to FIG. 1. The metal stack 300 has a plurality of metal layers 310a, 310b, 310c, 310d which may be made from aluminum, copper or any other suitable metal. A first metal layer 310a is connected to a second metal layer 310b by a plurality of vias 320, while the remaining layers 310c, 310d are similarly connected to one another. The first metal layer 310a is connected to a semiconductor substrate 330. Oxide insulators 332 are provided at either end of the semiconductor substrate 330. In this example, the fourth metal layer 310d is connected to a top metal layer 340, which may be made from aluminium, copper or any other suitable metal. The top metal layer 340 is coated by a nitride insulator layer 342. A portion of the nitride insulator layer 342 has been removed to create an aperture 350, such that the surface of the top metal layer 340 that is exposed through the aperture 350 defines a metal pad 360. As discussed above, an electrically conductive bump (not shown) may be electrically coupled to the metal pad 360.

Since each layer of the metal stack 300 is connected to each other layer of the metal stack 300 and to both the semiconductor substrate 330 and the top metal layer 340, the metal stack 300 can provide an effective thermal bridge between the substrate 330 and the metal pad 360. This thermal bridge may provide for effective heat transport between a power amplifier (not shown) provided on the semiconductor substrate 330 and the metal pad 360, and then to external circuitry, as described above.

If the metal stack 300 is also used as an electrical connector, the metal stack 300 can provide good electrical contact between an active layer of the substrate and the metal pad 360.

As discussed above, when the output transistors are placed partly under a metal pad, then the rest of the pad can be implemented as a so-called thermal pad. A thermal pad can be considered as a pad which advantageously uses all the backend metals in the metal stack down to the substrate (including the substrate contacts) to make a low thermal resistance path. Typically, the amount of metal may be increased in the metal stack of a thermal pad, until the limit where technology-specific design rules will impose limitations. In flip chip systems, the electro-thermal path can be dominantly through the bumps further down to the ground plane and/or the exposed diepad of the package.

Figure 5:
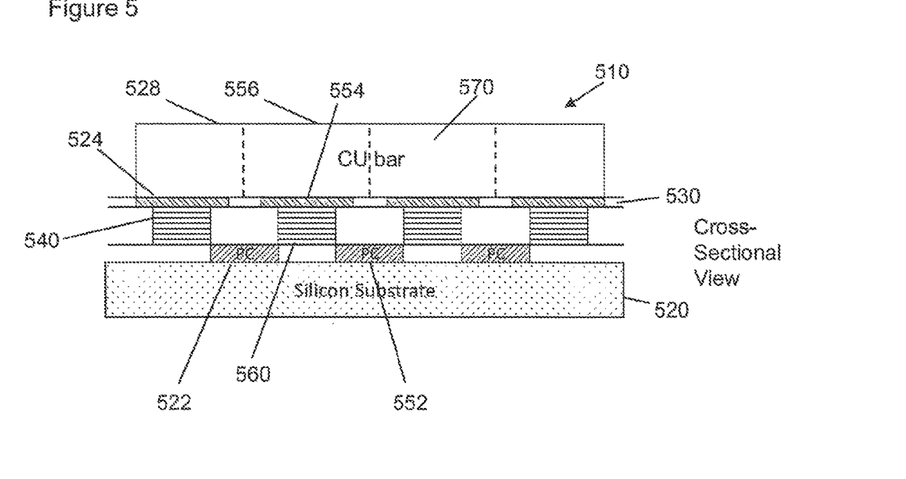
FIG. 5 shows an example embodiment of part of a flip chip circuit, shown in cross-section, with an integrally formed plurality of electrically conducting bumps.

FIG. 5 shows an alternative structure for a flip chip circuit 510 compared to the flip chip circuit of FIG. 1. Features of FIG. 5 that are similar to features of FIG. 1a have been given similar reference numerals and may not necessarily be discussed further here.

The flip chip circuit 510 has a first electrically conductive bump 528 and a second electrically conductive bump 556. The first electrically conductive bump 528 is coupled to a first metal pad 524 and the second electrically conductive bump 556 is coupled to a second metal pad 554. The first electrically conductive bump 528 is metallically coupled to the second electrically conductive bump 556. In this example, the first electrically conductive bump 524 and the second electrically conductive bump 556 are integrally formed, for instance as a solid copper bar 570. More generally, a plurality of electrically conductive bumps can be connected together, optionally as a single electrically conductive bump bar.

The electrically conductive bumps may be connected to a reference terminal such as an electrical ground terminal. Such bumps may be called ground bumps. A single electrically conductive bump bar may be referred to as an uninterrupted solid ground plane, which can be positioned across the power amplifiers 522, 552. The uninterrupted solid ground plane may be considered a type of elongated copper bump which may be used instead of individual cylindrical metal pillar types of bumps.

Use of an uninterrupted solid ground plane 570 enables heat to be conducted from the first power amplifier 522 to the second electrically conductive bump above the second metal pad 554. In this way, waste heat may be more efficiently removed from the flip chip to multiple parts of the external circuitry. This may advantageously reduce the formation of hotspots within the flip chip circuit 510 and thereby improve its efficiency and lifetime.

It will be appreciated that many different types of power amplifier may be integrated into flip chip circuits of the present disclosure. For example, a Doherty amplifier, which has a main stage having a main amplifier, and a peaking stage having a peaking amplifier, is one specific type of power amplifier that may be provided. In such an example, both the main amplifier and the peaking amplifier can comprise any flip chip circuit disclosed herein.

A significant application for flip chip circuits of the present disclosure is small-cell base station power amplifiers, but other applications like Wireless Local Area Networks (WLAN) or cellular power amplifier applications may also be suitable. Generally, any wireless communications base station may advantageously include a flip chip circuit of the present disclosure.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services.

These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:
1. A flip chip circuit comprising:
a semiconductor substrate;
a power amplifier provided on the semiconductor substrate;
a metal pad configured to receive an electrically conductive bump for connecting the flip chip to external circuitry;
wherein at least a portion of the power amplifier is positioned directly between the metal pad and the semiconductor substrate;
a temperature sensor having a temperature sensitive component provided proximal to the power amplifier, and
a controller, configured to control the power amplifier based on a temperature determined by the temperature sensor.

2. The flip chip circuit of claim 1,
further comprising a metal stack positioned between the metal pad and the power amplifier,
wherein the metal stack comprises a plurality of metal layers configured to provide a thermal bridge between the power amplifier and the metal pad.
3. The flip chip circuit of claim 1,
further comprising the electrically conductive bump coupled to the metal pad,
wherein the electrically conductive bump comprises a metal pillar that extends away from the metal pad and the semiconductor substrate.
4. The flip chip circuit of claim 1,
further comprising an insulating layer having an aperture,
wherein the metal pad is coupled to the electrically conductive bump through the aperture, and
wherein the electrically conductive bump extends across at least a portion of the insulating layer.
5. The flip chip circuit of claim 1,
wherein the power amplifier comprises a plurality of power transistors distributed across the semiconductor substrate.
6. The flip chip circuit of claim 1, comprising:
a plurality of power amplifiers provided on the semiconductor substrate;
a plurality of metal pads, each configured to receive an electrically conductive bump for connecting the flip chip circuit to external circuitry;
wherein at least a portion of each of the plurality of power amplifiers is positioned directly between a metal pad and the semiconductor substrate.
7. The flip chip circuit of claim 6,
wherein at least a portion of two or more of the plurality power amplifiers is positioned directly between the metal pad and the semiconductor substrate.
8. The flip chip circuit of claim 6,
wherein at least a portion of the power amplifier is positioned directly between two or more of the plurality of metal pads and the semiconductor substrate.
9. The flip chip circuit of claim 6,
further comprising a plurality of bias circuits, each bias circuit associated with one of the plurality of power amplifiers,
wherein the bias circuits are configured to provide bias voltages to the associated power amplifiers independently of each other.
10. The flip chip circuit of claim 6,
wherein an electrically conductive bump is coupled to each of the plurality of metal pads, wherein each of the electrically conductive bumps are metallically coupled to each other.
11. The flip chip circuit of claim 10,
wherein each of the electrically conductive bumps are integrally formed.
12. The flip chip circuit of claim 6:
wherein the temperature sensor includes a plurality of temperature sensitive components, each temperature sensitive component provided proximal to a respective one of the plurality of power amplifiers, and
wherein the controller is configured to control the plurality of power amplifiers based on the temperature determined by the temperature sensor.
13. The flip chip circuit of claim 12,
wherein each of the plurality of temperature sensitive comprises a NPN transistor.
14. The flip chip circuit of claim 1,
wherein the power amplifier comprises a BiCMOS integrated circuit.

15. A Doherty amplifier comprising:
a main stage comprising a main amplifier;
a peaking stage comprising a peaking amplifier;
wherein the main amplifier and the peaking amplifier each comprise a flip chip circuit of claim 1.

* * * * *